US007860256B1

(12) United States Patent
Diedrichsen

(10) Patent No.: US 7,860,256 B1
(45) Date of Patent: Dec. 28, 2010

(54) ARTIFICIAL-REVERBERATION GENERATING DEVICE

(75) Inventor: Steffan Diedrichsen, Hamburg (DE)

(73) Assignee: Apple Inc., Cupertino, CA (US)

( * ) Notice: Subject to any disclaimer, the term of this patent is extended or adjusted under 35 U.S.C. 154(b) by 1863 days.

(21) Appl. No.: 10/821,547

(22) Filed: Apr. 9, 2004

(51) Int. Cl.
*H03G 3/00* (2006.01)

(52) U.S. Cl. .......................................... 381/63; 84/630

(58) Field of Classification Search .................. 381/63, 381/64, 71.11; 375/350, 343, 232, 149-15, 375/367; 708/250, 271, 314, 322, 323, 420, 708/422, 425; 84/630
See application file for complete search history.

(56) References Cited

U.S. PATENT DOCUMENTS

| | | | | |
|---|---|---|---|---|
| 3,864,635 | A * | 2/1975 | Ewanus | 455/260 |
| 4,203,002 | A * | 5/1980 | Nossen | 375/368 |
| 4,989,158 | A * | 1/1991 | Sloane | 700/280 |
| 5,048,088 | A * | 9/1991 | Taguchi | 704/219 |
| 5,241,562 | A * | 8/1993 | Partyka et al. | 375/142 |
| 5,577,165 | A * | 11/1996 | Takebayashi et al. | 704/275 |
| 5,661,439 | A * | 8/1997 | Watkins et al. | 331/1 R |
| 5,715,363 | A * | 2/1998 | Tamura et al. | 704/205 |
| 5,796,845 | A * | 8/1998 | Serikawa et al. | 381/18 |
| 5,937,374 | A * | 8/1999 | Bartkowiak et al. | 704/209 |
| 5,953,697 | A * | 9/1999 | Lin et al. | 704/225 |
| 6,072,844 | A * | 6/2000 | Inoue et al. | 375/345 |
| 6,252,904 | B1 * | 6/2001 | Agazzi et al. | 375/233 |
| 6,307,941 | B1 * | 10/2001 | Tanner et al. | 381/17 |
| 6,751,322 | B1 * | 6/2004 | Carlbom et al. | 381/63 |
| 7,130,799 | B1 * | 10/2006 | Amano et al. | 704/262 |
| 7,217,879 | B2 * | 5/2007 | Ito | 84/630 |
| 7,243,065 | B2 * | 7/2007 | Stephens et al. | 704/226 |
| 7,280,623 | B2 * | 10/2007 | Gupta et al. | 375/343 |
| 7,434,134 | B2 * | 10/2008 | Agazzi et al. | 714/752 |
| 2003/0169887 | A1 * | 9/2003 | Fujita et al. | 381/63 |
| 2006/0050897 | A1 * | 3/2006 | Asada et al. | 381/98 |

* cited by examiner

*Primary Examiner*—Curtis Kuntz
*Assistant Examiner*—Hai Phan
(74) *Attorney, Agent, or Firm*—Blakely, Sokoloff, Taylor & Zafman LLP

(57) ABSTRACT

An artificial-reverberation generating device comprises in one embodiment a convolution engine in association with an impulse-response synthesizer. The impulse-response synthesizer preferably comprises a noise synthesizer and a control means for controlling one or more parameters of the noise synthesizer, the parameters corresponding to adjustable characteristics of the generated reverberation. The noise synthesizer is preferably a pseudo-random number generator, which is multiplied by the output signal of a density generator. The density generator output signal advantageously takes the form of a series of spikes of variable duration and time-interval spacing. The multiplier outputs feed a phase-correlation stage, followed by a time-variant filter stage and a time-variant amplifier stage. The output of the time-variant amplifier stage forms the output of the impulse-response synthesizer and is used to feed impulse-response information to the convolution engine.

18 Claims, 4 Drawing Sheets

ARTIFICIAL-REVERBERATION GENERATING DEVICE

BACKGROUND OF THE INVENTION

The present invention relates to an artificial-reverberation generating device. Such a device is employed where a musical signal has little or no reverberation content of its own, but it is desired to make the signal sound as though it originated in an acoustic space having a desired degree of reverberation.

It is known to generate artificial reverberation by at least two methods. The first method involves the use of an algorithm in a digital signal processing technique using a combination of delay lines and filters to diffuse the "dry" (i.e. non-reverberant) input signal. The process can be defined with the aid of a small set of parameters such as reverberation time, damping, density (i.e. number of reflections in a given time), etc. As such, therefore, the reverberation characteristics can be readily set by the user. The second method is based on the idea of convolution. This is also a digital signal processing technique and involves the convolution of the dry input signal with the impulse response of an acoustic space. This is illustrated in FIG. 1, in which a convolution engine 100 is fed with impulse-response information from one or more impulse-response files 116. The impulse-response files 116 contain samples of actual reverberant environments. One way of realising the convolution engine is to use a finite impulse response (FIR) filter 114, whose length is the length of the desired impulse response. Alternatively, it is possible to transform the impulse response into the frequency domain to reduce the demands on processing power. Some methods employ a combination of time-domain and frequency-domain processing by splitting up the impulse response.

Both of these basic methods have drawbacks. In music production, artificial reverberation tends to be evaluated in terms that refer more to subjective taste than to objective technical properties of the sound involved. Terms often used in assessing reverberation are "smoothness", "coloration" and "imaging". Such terms can be translated into more technical language: smoothness may be considered to be equivalent to density, coloration to eigenfrequency distribution and imaging to phase correlation. The main drawback of the algorithmic method is that the eigenfrequency distribution, density and phase correlation are all dependent on the particular algorithm employed. The result is a compromise between all of these properties and the CPU resources that are available. As regards the convolution method, the user is limited to the specific impulse responses made available to him. If a short reverberation is needed, the user must have access to the impulse response of a small room. On the other hand, to create a long reverberation tail, the impulse response of a large room must be provided. It is possible to modify the envelope of an available room impulse response, but the results are far from satisfactory, mainly due to the low reverberation density that tends to characterize the start of a room response. With the convolution method, then, it is necessary to have available a large library of ready-made impulse-response files, and this increases costs.

SUMMARY

One embodiment of the present invention seeks to combine the advantages of the algorithm-based and convolution-based reverberation-generation methods and provides a convolution reverberation device which functions with parameters known from the algorithmic class of reverberation processors. The artificial-reverberation generating device according to a preferred embodiment of the invention is based on the recognition that a decaying noise signal corresponds to an almost perfect reverberation tail. This is because noise has no eigenfrequencies and has an infinitely high density. Accordingly, the invention in one exemplary embodiment comprises a convolution engine used in conjunction with a specialized synthesizer, which preferably creates noises. The noises sound similar to a room response. Instead of loading a given fixed impulse response into a convolution engine, as in the known convolution-based reverberation generator, the present artificial reverberation device in one exemplary embodiment has a synthesizer which creates a data vector which is fed into the convolution engine as an impulse response.

In accordance with an embodiment of the invention, there is provided an artificial-reverberation generating device comprising a real-time convolution engine and an impulse-response synthesizer for supplying impulse-response information to the convolution engine. The impulse-response synthesizer is advantageously a noise synthesizer, with control means being provided for controlling one or more parameters of the noise synthesizer, thereby to control corresponding characteristics of the generated reverberation.

Instead of the recorded impulse responses stored in multiple files in the known convolution-based method, certain embodiments of the present invention make use of a specialized synthesizer that creates impulse responses sounding similar to room impulse responses. The characteristics of the reverberation can be readily set by the user using appropriate inputs. In addition, the synthesizer does not use an algorithm, as in the above-described known method, and therefore does not have to employ complex ray-tracing or mirror-source techniques to provide the desired impulse responses. The parameter set required is much reduced and is similar to that used in a subtractive synthesizer. This artificial-reverberation generating device therefore enjoys, in comparison with the known techniques, a reduced processing overhead at the same time as a capacity for generating very realistic reverberation characteristics easily pre-defined by the user.

Specific realizations of the reverberation generating device according to the invention are set forth in the dependent claims.

BRIEF DESCRIPTION OF THE DRAWINGS

The invention will now be described, by way of example only, with the aid of the appended drawings, of which.

DESCRIPTION OF A PREFERRED EMBODIMENT

Figure 1:
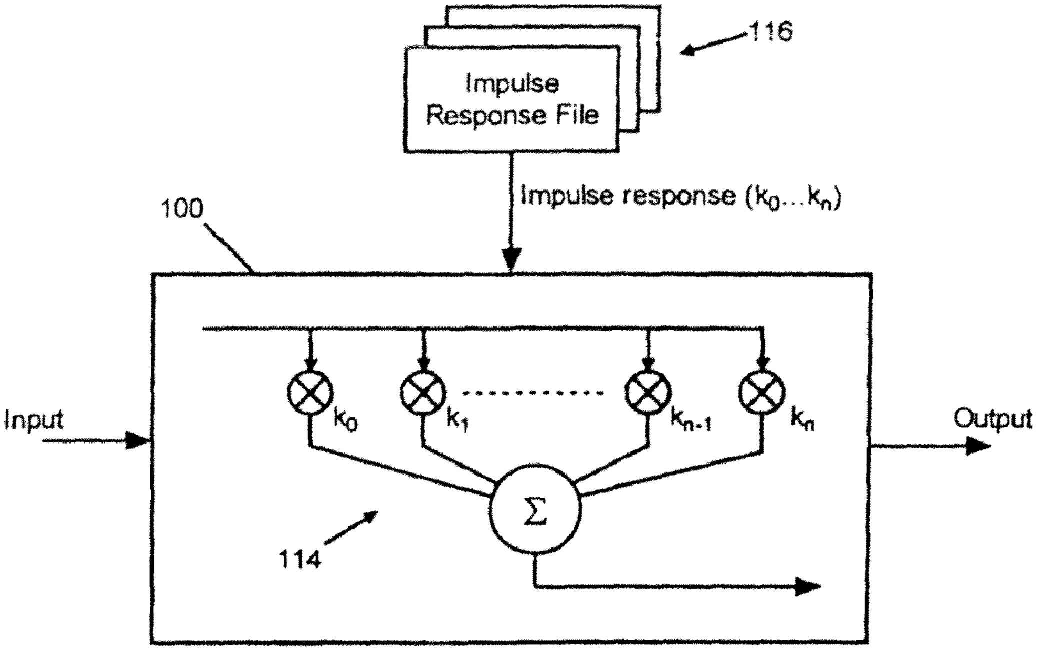
Fig 1 (PRIOR ART)
FIG. 1 is a schematic diagram of a known convolution-based artificial-reverberation generating scheme.
Figure 2:
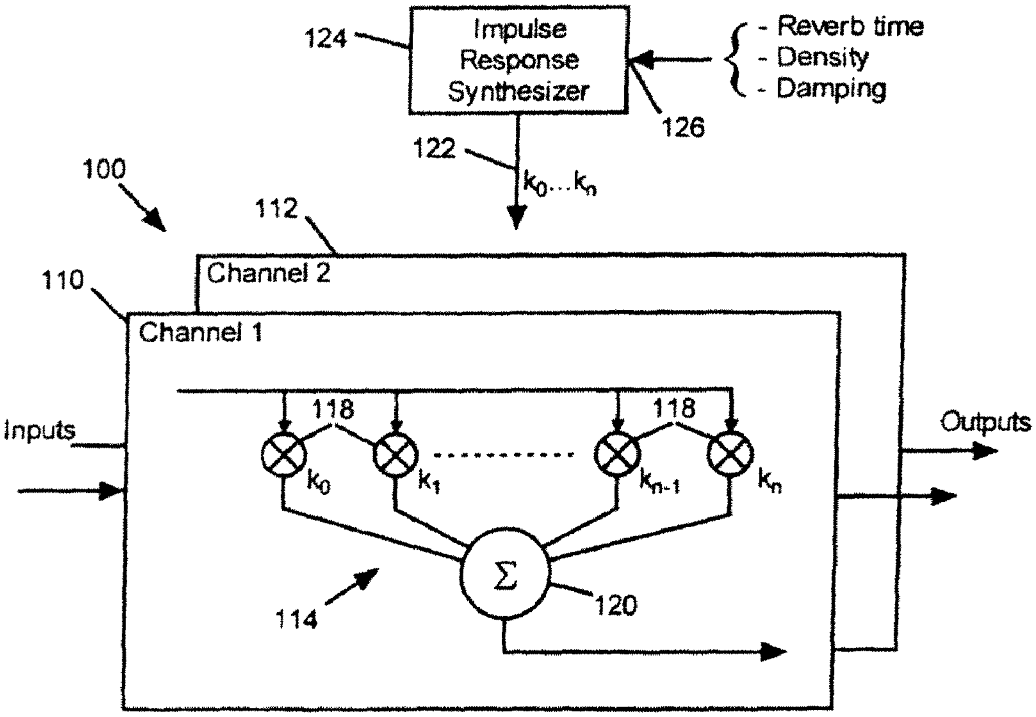
FIG. 2 is a schematic diagram giving an overview of an embodiment of an artificial-reverberation generating device according to the invention.

The broad principle of an exemplary embodiment of the invention is shown in FIG. 2. In FIG. 2 a convolution engine 100 is shown consisting of two channels, 110 and 112, which correspond to the normal stereo audio channels to be found in most audio environments. Each channel comprises an FIR filter 114 of known configuration having weighting coefficients $k_0$, $k_1$ . . . $k_n$, which are supplied from an impulse response synthesizer 124 along a line 122. The outputs of the multipliers 118 weighted by the coefficients $k_0$, $k_1$ . . . $k_n$ are summed in a summer 120, the output of which forms the output of the convolution engine.

In place of the numerous impulse-response files of the known convolution method, which files contain samples corresponding to fixed reverberative environments, i.e. rooms of various sizes, large halls, etc, the synthesizer 124 is capable of creating custom impulse responses defined by the user. To this end the synthesizer is shown as having a control-input facility 126 for setting such parameters as reverberation time, density and damping.

Figure 3:
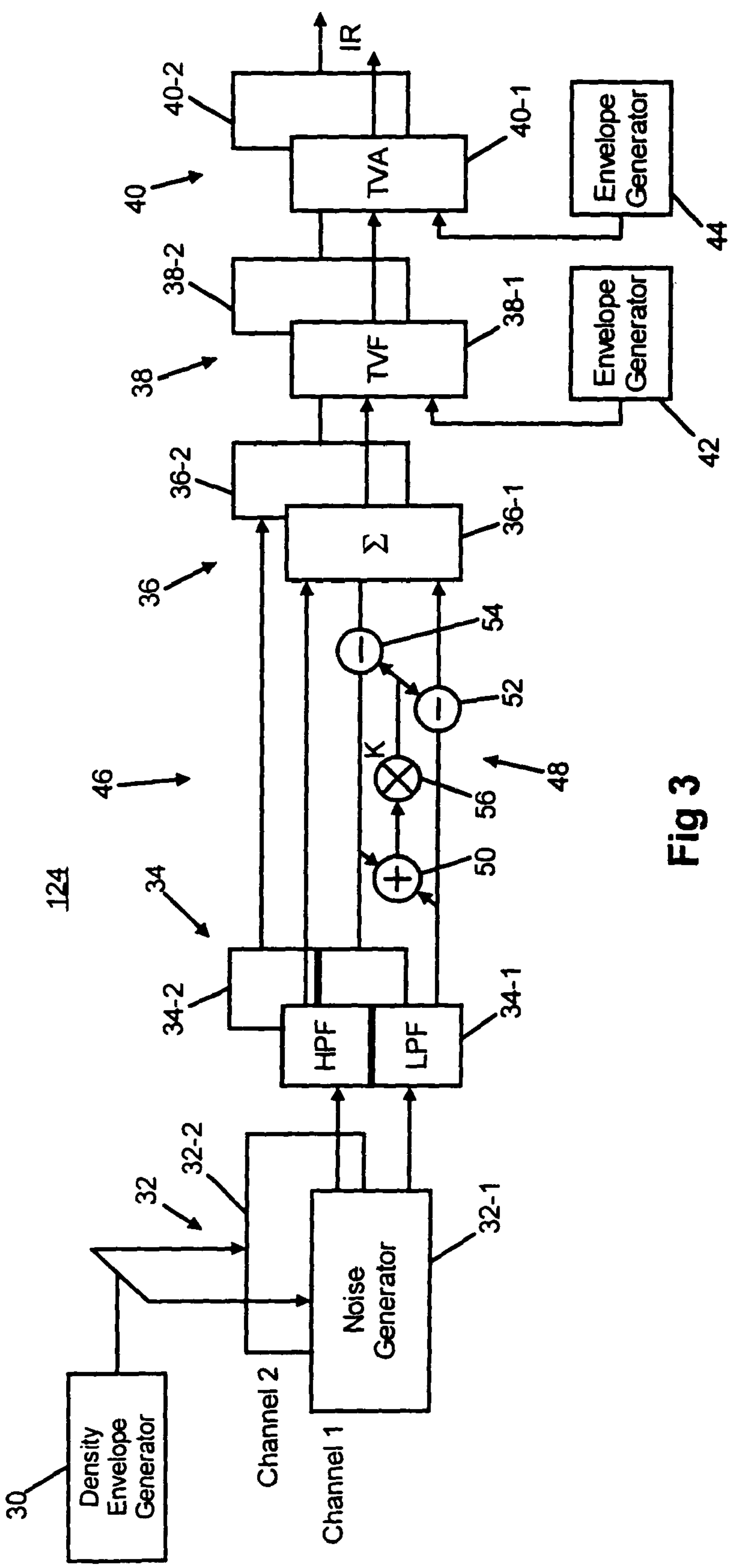
FIG. 3 is a detailed schematic diagram of the impulse response synthesizer shown in FIG. 2.

The impulse response synthesizer 124 is illustrated in greater detail in FIGS. 3 and 4 and will be described in the first instance in relation to the first audio channel only. The synthesizer 124 comprises (see FIG. 3) a noise generator 32, a phase-correlation control section 46, a filter section 38 and an envelope generator section 40.

The noise generator section is the most complex part of the synthesizer, since it maps two properties associated with algorithmic reverb units, namely density and phase correlation. To create a noise with these properties, different noise sources are required in order to be able to obtain a decorrelated signal for the different channels, and a density generator is required for each of the noise sources. Two separate but identical noise generators are therefore employed for the first channel. Each of these noise generators in the preferred embodiment comprises (see FIG. 4) a pseudo-random number generator 320-1*a*/320-1*b*, which co-operates with a density generator 322-1*a*/322-1*b* and a multiplier 324-1*a*/324-1*b*. The output of the pseudo-random number generator is multiplicatively combined with the output of the density generator in the multiplier and the result of the multiplication process is taken to a filter stage 34-1 (see FIG. 3) consisting of a low-pass filter (LPF) and a high-pass filter (HPF). The output of multiplier 324-1*b* is taken to the input of the low-pass filter, while the output of multiplier 324-1*a* is taken to the input of the high-pass filter.

Figure 5:
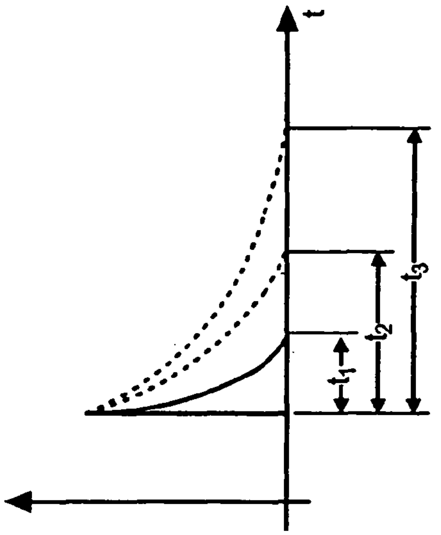
FIG. 5 is a waveform diagram showing spikes generated in the density generator shown in FIG. 4.

Density is defined as the number of reflections per unit time. Natural reverberation has a time-variant density. When a sound stops, the subsequent reverberation is of low density involving single reflections. As time progresses, however, the density increases and the reverberation becomes more diffuse. To achieve this behaviour, the preferred embodiment employs a spike generator as the density generator 322-1*a*/322-1*b*, which generates spikes of definable decay time. FIG. 5 shows a typical spike having a decay time to virtually zero amplitude of $t_1$ seconds. Two different decay times are also shown in dotted lines: these are times $t_2$ and $t_3$ seconds, respectively. The spacing between the spikes can be randomly varied between 0 seconds and a maximum time interval, $T_{max}$ seconds (see FIG. 6).

The decay time of the spikes can be adjusted by the user. A short decay time results in a Dirac-like spike, which creates a very sharp echo, while a long decay time blurs the signals and the echo sounds softer and more reverberant.

The series of spikes generated by the density generators 322-1*a* and 322-1*b* is multiplied with noise generated by the pseudo-random number generators 320-1*a* and 320-1*b*, respectively to provide the outputs of the noise generator section for the first channel.

Figure 6:
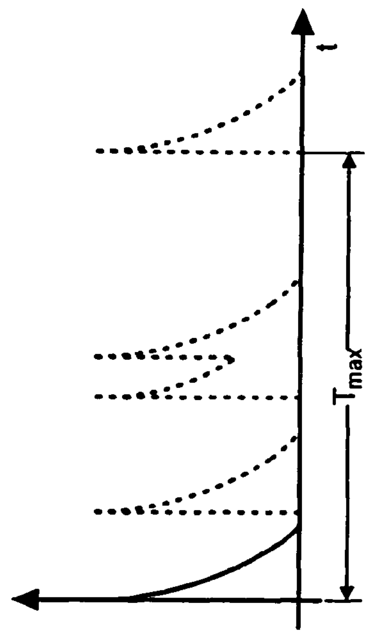
FIG. 6 is a waveform diagram showing a variable time interval between successive spikes generated by the density generator of FIG. 4.
Figure 4:
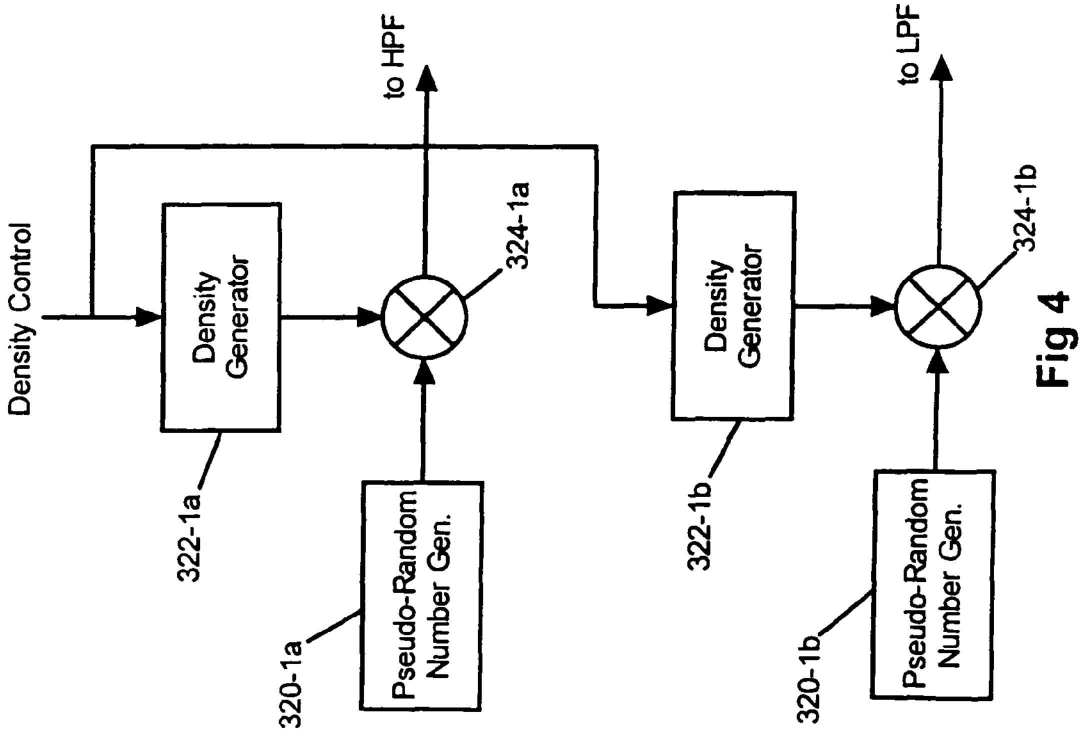
FIG. 4 is a schematic diagram illustrating an embodiment of the noise generator and density envelope generator shown in FIG. 3.

The temporal progression of the density is controlled by a density envelope generator 30 (FIG. 3), which provides the input quantity "Density Control" shown in FIG. 4. By adjusting the "Density Control" input, the user varies the randomness of the spacing between the spikes. This randomness can result in a new spike being generated before the preceding one has died away. The graph of FIG. 6 shows such a situation in the case of the third and fourth spikes. The fourth spike starts while the third is still heading towards zero. Only the first spike is shown as in full lines in FIG. 6, since it is only that spike which provides the trigger signal for the oscilloscope-type signal shown in this figure. Spikes following the first occur at a randomly chosen interval. It is the maximum value of that interval ($T_{max}$) which is controlled by the density envelope generator via the "Density Control" input.

The outputs of the low-pass and high-pass filter stage 34-1 are summed in a summing section 36-1 and the output of the summing section 36-1 is taken to a time-variant filter 38-1. The output of the filter 38-1 is, in turn, taken to a time-variant amplifier 40-1. The output of the amplifier 40-1 forms the "impulse response" output of the first audio channel and feeds the convolution engine 110 shown in FIG. 2.

The low-pass and high-pass filters are arranged to have respective cut-off frequencies such that, when the outputs of these filters are summed in the summing sections 36-1, the frequency response of the summed signal is substantially flat, i.e. there is little or no coloration. Depending on the type of filter used, the two cut-off frequencies may need to be offset by a given amount to achieve this, though they may be set to approximately the same cut-off frequency with some possible consequent coloration.

Natural reverberation has a frequency-dependent reverberation time caused by the phenomenon of dispersion. The preferred embodiment of the present invention simulates this effect by processing the noise signal through a time-variant filter 38-1, which is preferably constituted by a low-pass filter. The cut-off frequency of the low-pass filter 38-1 is set by the user through an envelope generator 42. The final processing stage is the amplitude envelope generator section 40. This section is based around a variable-gain amplifier 40-1, the gain of which is controlled by the user through an envelope generator 44, which creates the desired curve for defining the gain over time. A decaying curve will create a natural-sounding reverberation.

The same arrangement that has just been described in connection with the first audio channel exists for the second audio channel also, in which case the various reference numerals are designated xx-2 instead of xx-1. The output of the time-variant amplifier 40-2 associated with the second channel is taken to the convolution engine 112 shown in FIG. 2. The envelope generator 42 will normally be arranged to control the time-variant filters 38-1, 38-2 for both channels, and similarly for the envelope generator 44 in connection with the time-variant amplifiers 40-1, 40-2.

To create a spatial impression in the resultant sound, the seeds of the pseudo-random number generators 320-1*a* and 320-1*b* associated with the first channel are different from the seeds of the pseudo-random number generators 320-2*a* and 320-2*b* associated with the second channel. In addition, in order to enhance the impression of a lateral audio, the outputs of the filter section 34 (see FIG. 3) are passed through a matrix 48 to cancel out any correlated signal portions. This then leaves only uncorrelated noise. The matrix 48 comprises a summer 50, two subtractors 52, 54 and a coefficient multiplier 56. The outputs of the two low-pass filters associated with the two channels are summed in the summer 50 and the result of this summing operation is multiplied by the coefficient K defined for the multiplier 56. The K-multiplied sum is then subtracted in subtractors 52, 54 from the signals on each of the outputs of the low-pass filters before these signals reach their respective summing stages 36-1, 36-2.

Only the low frequencies are matrixed. It is the low-frequency content of a reverberation which controls the envelopment of the reverberation. The high frequencies are left untouched in order to maintain the stability of the stereo image. The effect of the matrix is to widen the reverberation envelopment by increasing the illusion of lateral audio in the low-frequency region.

Figure 7:
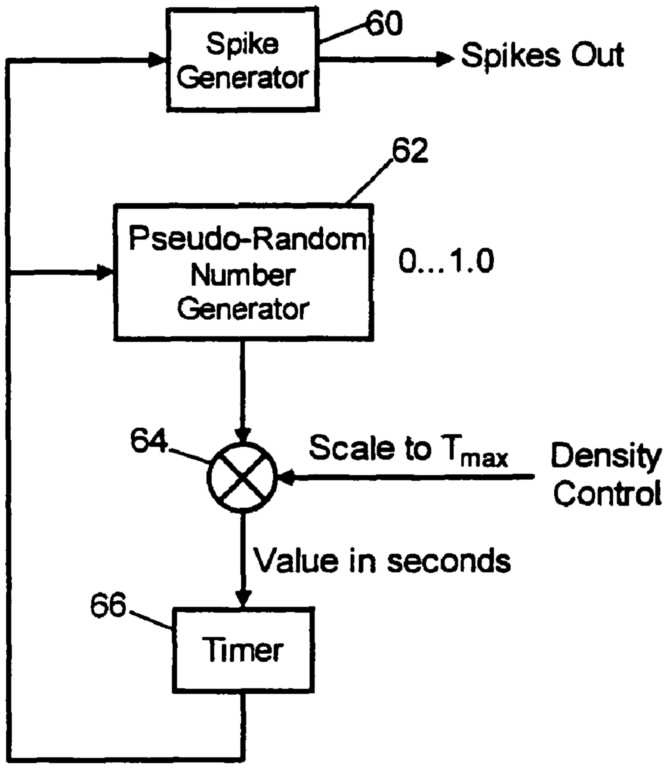
FIG. 7 is a schematic diagram of a representative embodiment of a density generator as employed in an artificial-reverberation generating device according to the invention.
Figure 8:
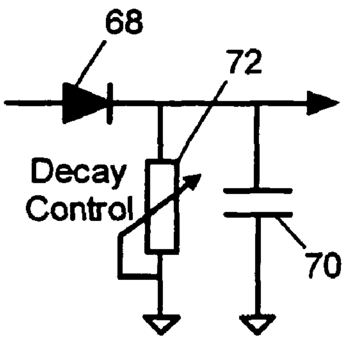
FIG. 8 illustrates one possible realisation of a spike generator as employed as part of the density generator of FIG. 7.

An example of a density generator is shown in FIGS. 7 and 8. In FIG. 7 a random number generator 62 generates random numbers between two limits, namely zero seconds and, in the example shown, 1.0 second. The output of the number generator 62 feeds an input of a multiplier 64, the other input of which constitutes the density control shown in FIG. 4. The output of the multiplier 64 acts as a trigger for a programmable timer 66, which gives out, after a delay determined by the value at the multiplier output, a narrow pulse of a fixed width for triggering both the random number generator 62 and the spike generator 60. The spike generator may take the form of the network shown in FIG. 8, in which the input of the spike generator feeds a diode 68, the output of which feeds a parallel R-C arrangement consisting of a capacitor 70 and a variable resistor 72.

In operation it is assumed that the timer 66 has just produced its trigger pulse, so that the capacitor 70 is virtually instantaneously charged by way of the diode 68. When the trigger pulse disappears, the capacitor 70 discharges at a rate set by the variable resistor 72. This rate is determined by the user and produces the decay shown as times $t_1/t_2/t_3$ in FIG. 5. At the same time as the capacitor 70 is charged, the random number generator 62 is triggered to produce a random number between the limits just described, and which may be, for example, 0.2 seconds. This number is then scaled up or down by the multiplier 64 in accordance with the density control value set by the user. When set to its upper limit, which purely by way of example may be, say, a value of 10, this density control value will then multiply the 0.2 second number generator output by 10 to produce a value of 2 seconds. This causes the timer 66 to wait for 2 seconds before giving out its next trigger pulse, which will then start the whole process over again, but this time with a possibly different random number output by the number generator 62. The result is a series of decaying spikes of random time interval, as shown in FIG. 6. The maximum value of that time interval will be 10 seconds in this example.

The invention as described and illustrated can be implemented either in mainly software terms or in mainly hardware terms, depending on the requirements of the user. For example, one or more embodiments of the invention may be implemented in software (stored or provided by a machine readable medium) which is executed on a general purpose computer (e.g. a G5 Power Mac from Apple Computer of Cupertino, Calif.) or other types of data processing systems (e.g. a special purpose music synthesizer, etc.). Examples of data processing systems are described and shown in U.S. Pat. No. 6,222,549 which is hereby incorporated herein by reference.

In addition, although it has been assumed that there will be two audio channels, more than two may exist in the audio setup in which the synthesizer according to the invention is to be employed. In this case there will be a noise generator, density generator, phase correlation section, filter section and amplitude generator section for each channel and a decorrelation matrix 48 for each of the two pairs of channels. This will preferably take the form of a first matrix for the low-pass filters of the front left and front right channels and a second matrix for the low-pass filters of the rear left and rear right channels.

Furthermore, it is possible to exchange the positions of the time-variant filter 38 and time-variant amplifier 40 sections (see FIG. 3) so that the filter section 38 is downstream of the amplifier section 40.

Although in FIG. 4 the density generators 322-1*a* and 322-1*b* have been shown as different devices, in practice they may take the form of a single, common density generator supplying identical spikes to the two pseudo-random number generators. Indeed, it is also possible to arrange for this common density generator to supply the same output for the noise generators of not just the first channel, but of the other channel as well. However, while this is feasible, it is much preferred to employ different density generators in each case in order to create the illusion of lateral reflection during the early reverberation phase. With a single common density generator this property would be lost. Hence ideally each density generator will have its own pseudo-random number generator with associated unique seed to ensure the creation of uncorrelated spikes.

In summary, the above described embodiments of the present invention are based on the known real-time convolution method of generating artificial reverberation, but with the fixed impulse-response files containing sample information relating to known acoustic spaces replaced by a specialized impulse-response synthesizer comprising a noise synthesizer. The user synthesizes a desired impulse response by supplying appropriate inputs relating to parameters to be varied (e.g. reverberation time, density and damping). This combination of an impulse-response synthesizer and a real-time convolution engine provides the flexibility of an algorithm-based reverberation scheme, but with the much better quality associated with the use of the real-time convolution engine. In addition, considerable storage space is saved by dispensing with the numerous impulse-response files associated with the known convolution-based method. A method, in the above described embodiments, for generating artificial reverberation includes synthesizing noise to generate impulse response information for use in a convolution, and performing a convolution based on said impulse response information to generate artificial reverberation. In this method, the synthesizing noise comprises generating pseudo-random numbers and the method also includes filtering noise from said synthesizing and generating a signal envelope from filtered noise. Also in this method, the convolution comprises receiving an input data representing a sound and receiving said impulse response information and generating a plurality of multiplication results weighted from said impulse response information and said input data and summing said plurality of multiplication results.

I claim:

1. An electronic device to generate artificial reverberation, comprising:

a signal processing engine that, when viewed in the time domain, convolves an input signal with an impulse response representing acoustic space;

a synthesizer communicatively coupled to said signal processing engine, said synthesizer to provide to said signal processing engine, when viewed in the time domain, a definition of said impulse response, said synthesizer comprising a first random number generator and a first density generator to provide, when viewed in the time domain, a first sequence of randomly spaced spikes, said synthesizer further comprising, a second random number generator and a second density generator to produce, when viewed in the time domain, a second sequence of randomly spaced spikes, wherein, said first and second sequences of randomly spaced spikes have, when viewed in the time domain, decay envelopes and maximum spacings between spikes that are user defined and customizable, wherein each of the signal processing engine, the first and second random number generators and the first and second density generators are constructed with electronic circuitry.

2. The device of claim 1 wherein the synthesizer further comprises a high pass filter and a low pass filter, the high pass filter coupled downstream from the first random number generator and first density generator, the low pass filter coupled downstream from the second random number generator and the second density generator.

3. The device of claim 2 further comprising a time variant filter coupled downstream from said high pass filter and said low pass filter.

4. The device of claim 3 further comprising a variable gain amplifier coupled downstream from said time variant filter.

5. The device of claim 1 wherein the first and second random number generators and the first and second density generators are part of a first signal processing channel within said synthesizer, and said synthesizer further comprises a second signal processing channel, said second signal processing channel comprising third and fourth random number generators and third and fourth density generators to create third and fourth sequences of spikes.

6. The device of claim 5 wherein said synthesizer further comprises a third signal processing channel between said first and second signal processing channels, said third signal processing channel to cancel correlated signal portions of the first and second signal processing channels.

7. A method of generating artificial reverberation, comprising:

accepting first customizable user input;

accepting second customizable user input;

generating a signal that when viewed in the time domain comprises first and second sequences of spikes having decay envelopes defined by said first customizable user input and maximum spacings between spikes defined by said second customizable user input, said first sequence of spikes generated with a first random number generator and a first density generator, said second sequence of spikes generated with a second random number generator and a second density generator;

processing said signal with a signal processing channel to define, when viewed in the time domain, an impulse response of acoustic space;

when viewed in the time domain, convoluting with a signal processing engine said impulse response with an input signal to artificially reverberate said input signal, wherein, said first and second random number generators, said first and second density generators, said signal processing channel and said signal processing engine are constructed with electronic circuitry.

8. The method of claim 7 wherein said processing of said signal with a signal processing channel further comprises, when viewed in the time domain, passing said first sequence of spikes through a high pass filter and passing said second sequence of spikes through a low pass filter.

9. The method of claim 8 wherein said processing of said signal with a signal processing channel further comprises, when viewed in the time domain, filtering with a time variant filter a signal formed from a combination of said high pass and low pass filters' respective output signals.

10. The method of claim 9 wherein said method further comprises amplifying an output signal of said time variant filter with a variable gain amplifier.

11. The method of claim 7 further comprising, when viewed in the time domain, processing third and fourth sequences of spikes with a second signal processing channel to define said impulse response.

12. The method of claim 11 further comprising cancelling correlated signal portions of the first and second signal processing channels.

13. A non-transitory storage medium containing stored processor executable instructions that when processed by a processor cause a method of generating artificial reverberation to be performed, said method comprising:

accepting first customizable user input;

accepting second customizable user input;

generating a signal that when viewed in the time domain comprises first and second sequences of spikes having decay envelopes defined by said first customizable user input and maximum spacing between spikes defined by said second customizable user input, said first sequence of spikes generated with a first random number generator and a first density generator, said second sequence of spikes generated with a second random number generator and a second density generator;

processing said signal with a signal processing channel to define, when viewed in the time domain, an impulse response of acoustic space;

when viewed in the time domain, convoluting with a signal processing engine said impulse response with an input signal to artificially reverberate said input signal.

14. The non-transitory storage medium of claim 13 wherein said method further comprises:

when viewed in the time domain, passing said first sequence of spikes through a high pass filter and passing said second sequence of spikes through a low pass filter.

15. The non-transitory storage medium of claim 14 wherein said method further comprises:

when viewed in the time domain, filtering with a time variant filter a signal formed from a combination of said high pass and low pass filters' respective output signals.

16. The non-transitory storage medium of claim 15 wherein said method further comprises:

amplifying an output signal of said time variant filter with a variable gain amplifier.

17. The non-transitory storage medium of claim 13 wherein said method further comprises:

processing third and fourth sequences of spikes with a second signal processing channel to define said impulse response.

18. The non-transitory storage medium of claim 17 wherein said method further comprises:

cancelling correlated signal portions of the first and second signal processing channels.

* * * * *

UNITED STATES PATENT AND TRADEMARK OFFICE

CERTIFICATE OF CORRECTION

PATENT NO. : 7,860,256 B1
APPLICATION NO. : 10/821547
DATED : December 28, 2010
INVENTOR(S) : Steffan Diedrichsen It is certified that error appears in the above-identified patent and that said Letters Patent is hereby corrected as shown below:

In column 7, line 15, in claim 1, delete “wherein” and insert -- wherein, --, therefor.

Signed and Sealed this
Twenty-fifth Day of October, 2011

David J. Kappos
*Director of the United States Patent and Trademark Office*